(12) United States Patent
Heuken et al.

(10) Patent No.: US 7,135,073 B2
(45) Date of Patent: Nov. 14, 2006

(54) METHOD AND SYSTEM FOR SEMICONDUCTOR CRYSTAL PRODUCTION WITH TEMPERATURE MANAGEMENT

(75) Inventors: Michael Heuken, Aachen (DE); Gert Strauch, Aachen (DE); Harry Protzmann, Aachen (DE); Holger Jürgensen, Aachen (DE); Oliver Schön, Herzogenrath (DE); Dietmar Schmitz, Aachen (DE)

(73) Assignee: Aixtron AG (DE)

( * ) Notice: Subject to any disclaimer, the term of this patent is extended or adjusted under 35 U.S.C. 154(b) by 47 days.

(21) Appl. No.: 09/873,041

(22) Filed: Jun. 1, 2001

(65) Prior Publication Data

US 2002/0001953 A1    Jan. 3, 2002

Related U.S. Application Data

(63) Continuation of application No. PCT/DE99/03863, filed on Dec. 2, 1999.

(51) Int. Cl.
*C30B 25/00* (2006.01)
(52) U.S. Cl. ............... 117/86; 117/84; 117/85; 117/89; 117/105
(58) Field of Classification Search .......... 117/84, 117/85, 86, 89, 105
See application file for complete search history.

(56) References Cited

U.S. PATENT DOCUMENTS

| | | | | |
|---|---|---|---|---|
| 3,617,371 A * | 11/1971 | Burmeister, Jr. | ............... | 117/99 |
| 5,070,815 A | 12/1991 | Kasai et al. | ............... | 118/725 |
| 5,108,540 A * | 4/1992 | Frijlink | ............... | 117/98 |
| 5,256,595 A * | 10/1993 | Flemish et al. | ............... | 117/99 |
| 5,378,501 A | 1/1995 | Foster et al. | ............. | 427/255.2 |
| 5,402,748 A * | 4/1995 | Takai et al. | ............. | 117/84 |
| 5,593,608 A * | 1/1997 | Suzuki | ............. | 219/492 |
| 5,614,247 A | 3/1997 | Barbee et al. | ............. | 427/8 |
| 5,755,886 A | 5/1998 | Wang et al. | ............. | 118/715 |
| 6,086,673 A * | 7/2000 | Molnar | ............. | 117/90 |
| 6,373,033 B1 * | 4/2002 | de Waard et al. | ............. | 219/497 |

FOREIGN PATENT DOCUMENTS

| | | | |
|---|---|---|---|
| JP | 63154085 A * | 6/1988 | |
| WO | WO 97/08356 | 3/1997 | |
| WO | WO 9835531 A1 * | 8/1998 | |

OTHER PUBLICATIONS

Schmitz et al. "MOVPE growth of InGaN on sapphire using growth initation cycles". Material Science and Engineering B 43 (1997) pp. 228-236.*

(Continued)

*Primary Examiner*—Yogendra N. Gupta
*Assistant Examiner*—Matthew J. Song
(74) *Attorney, Agent, or Firm*—St. Onge Steward Johnston & Reens LLC

(57) ABSTRACT

What is described here is a method and a temperature management and reaction chamber system for the production of nitrogenous semiconductor crystal materials of the form $A_X B_Y C_Z N_V M_W$, wherein A, B, C represent elements of group II or III, N represents nitrogen, M represents an element of group V or VI, and X, Y, Z, V, W represent the mol fraction of each element in this compound, operating on the basis of gas phase compositions and gas phase successions. The invention excels itself by the provisions that for the production of the semiconductor crystal materials the production process is controlled by the precise temperature control of defined positions in the reaction chamber system under predetermined conditions.

19 Claims, 11 Drawing Sheets

OTHER PUBLICATIONS

Patent Abstracts of Japan. English abstract o JP 63-154085 (1988).*
Ram et al. "Modelling Furnace Operations Using Simulation and Heuristics". Proceedings of the 1998 Winter Simulation Conference, 1998, pp. 957-963.*
H. Jürgenson, D. Schmitz, G. Strauch, E. Woelk (all Aixtron AG) and M. Dauelsberg, L. Kadinski, Yu. N. Mararov (all University of Erlangen-Nürnberg); MOCVD Equipment for Recent Developments Towards the Blue and Green Solid State Laser; Jun. 22, 1996; 14 pg.

D. Schmitz, E. Woelk, G. Strauch, M. Deschler, H. Jürgenson; MOVPE Growth of InGaN on Sapphire Using Growth Initiation Cycles; 1997; 9 pg.

R. Beccard, R. Niebuhr, B. Wachtendorf, D. Schmitz, H. Jürgensen; Multiwafer MOVPE Technology for Low Dimensional Ga-Al-In-N Structures; 1998; pp. 39-43.

* cited by examiner

METHOD AND SYSTEM FOR SEMICONDUCTOR CRYSTAL PRODUCTION WITH TEMPERATURE MANAGEMENT

CROSS-REFERENCE TO RELATED APPLICATIONS

This application is a continuation of pending International Application PCT/DE99/03863 filed on Dec. 2, 1999, which designates the United States. This application claims priority of German Patent Application DE19855637.3 filed on Dec. 2, 1998.

FIELD OF THE INVENTION

The present invention relates to a method and a system for the production of nitrogenous semiconductor crystal materials of the form $A_X B_Y C_X N_V M_W$, wherein A, B, C represent elements of group II or III, N represents nitrogen, M represents an element of group V or VI, and X, Y, Z, V, W represent the mol fraction of each element in this compound, operating on a temperature management system.

PRIOR ART

Binary, ternary and quaternary compound semiconductors such as GaAs, InP, $Al_x Ga_{1-x} As$, $In_x Ga_{1-x} As$, $(Al_x Ga_{1-x})_y In_{1-y} P$ and $In_x Ga_y As_{1-x} P_{1-y}$ are presently used in several electronic and opto-electronic devices. The complex successions of strata may be produced from the gaseous phase that carries the elements to be incorporated into the lattice. The composition, doping and succession of strata are usually determined by the composition of the gaseous phase as well as by the switching sequence of the gaseous phase, operating on a constant temperature. This corresponds to the current state of the art in the production of high-quality materials for components. Nitrogenous semiconductors such as GaN, InGaN, AlGaN, GaAsN, i.e. semiconductors of the form $A_X B_Y C_Z N_V M_W$ (A, B, C representing elements of group II or III, N being nitrogen, M representing an element of group V or VI, and X, Y, Z, V, W corresponding to the mol fraction of each element in this compound) may be produced in different ways. In accordance with the present invention a temperature management system us used for the production of $A_X B_Y C_Z N_V M_W$ materials (which will be referred to as nitrogenous semiconductor materials in the following.

In accordance with prior art, the characteristics of the nitrogenous semiconductor materials are determined by the composition of the gaseous phase and also by the switching sequence of the gaseous phases in the production process. Temperatures are maintained at a constant level. As only two parameters are employed for determining the characteristics of the nitrogenous semiconductor materials this kind of definition of the characteristics must rather be described as fairly non-differentiated. This means that even though it is possible to determine the composition, doping and succession of strata, an optimum matching is very difficult in consideration of other desirable properties described below, which leads to a complex production process involving a great number of process steps. Hence the production period is extended while the manufacturing costs are high.

BRIEF DESCRIPTION OF THE INVENTION

The present invention is based on the problem of providing a method and a system for the production of nitrogenous semiconductor crystal materials of the form $A_X B_Y C_Z N_V M_W$, wherein A, B, C denote elements of group II or III, N represents nitrogen, M corresponds to an element of group V or VI, and X, Y, V, W represent the mol fraction of each element in this compound, which permit a better differentiated determination of characteristics. This means that in addition to a determination of the composition, doping and succession of strata an optimum matching should still become possible when further desirable characteristics are considered which will be described in the following. In this approach complex production processes including a great number of process steps should be avoided. As a consequence, the production period and the manufacturing costs will be reduced.

The problem underlying the present invention will be solved by a method according to the main claim. Improvements of the inventive method are the subject matters of the dependent claims.

The problem underlying the present invention is also solved by a temperature management and reaction chamber system according to a parallel claim. Improvements of the inventive temperature management and reaction chamber system are the subject matters of the dependent claims.

In accordance with the present invention the dynamic development of all temperatures is controlled. Temperature variations occur particularly within the range of seconds. As, at the same time, other characteristics may be changed in the reactor, e.g. substitution of hydrogen for nitrogen as carrier gas and hence varied thermal conductivity, the correlations between the temperatures—e.g. between the upper side of the reaction chamber $T_7$ and the RF coil $T_8$—are equally variable in time (cf. also FIG. 3) and can be controlled.

According to the present invention, the inventive temperature management system considers the temperatures, the temperature dynamics, temperature ranges and the correlation of all temperatures as well as the varying process parameters in the reactor.

In accordance with the present invention, the temperature management system is based particularly on temperature profiles which have been determined, for instance, on the basis of numeric simulations.

In the aforementioned semiconductor crystal material compounds specifically dynamic temperatures and dynamic thermal processes are applied in order to achieve the desired stratum characteristics.

According to the present invention, at least two parameters of an absolute temperature and/or temperature variation from a temperature of an inlet $T_1$, of chamber walls $T_2$, of principal wafer supports $T_3$, of rotating individual wafer supports $T_4$, of a gas outlet $T_5$, of a gas mixture system $T_6$, of the upper side of a reaction chamber $T_7$ and of a heating system $T_8$ are controlled in correspondence with (correlating) temperature variation profiles at least in the range of seconds for dynamically controlling thermal process taking place in consideration of the variation of further process parameters in the reactor (in combination with the process gases such as the substitution of the carrier gas) for the selective creation of materials characteristics which produce expedient effects on components, particularly on electronic and opto-electronic components.

In correspondence with the invention, preferably HF (high-frequency) heating means are controlled by the temperature management system and used to achieve the temperatures and the temperature dynamics.

With the advantageous features of the solution according to the main claim it is possible to produce defined strata, interfaces and successions of strata or hetero structures and structures from these semiconductor crystal materials having adjustable electrical and optical characteristics such as X, Y, Z, V, W compositions of the compound from zero to 100%, specific electrical electron concentrations up to $10^{20}$ cm$^{-3}$ and specific electrical hole concentrations up to $8 \times 10^{18}$ cm$^{-3}$.

The inventive temperature management system is particularly subject to the specific demands on the production of nitrogenous semiconductor crystal materials.

$A_X B_Y C_Z N_V M_W$ materials and stratified systems as well as doped stratified systems can be expediently produced.

A high homogeneity in a lateral direction can be expediently achieved as well.

Moreover, a high degree of reproducibility can be expediently achieved.

Devices or components can be expediently produced. In production the behaviour of the components or their characteristics, respectively, such as colour and luminous intensity or a light-emitting diode can be determined. It is possible, for example, to produce defined field emitters.

Piezoelectric fields and interface states can be equally determined.

Quantum wells can be expediently manufactured.

An expedient advantage is the possibility to implement n-type and p-type doping at the same time.

A reproducible manufacture of $A_X B_Y C_Z N_V M_W$ materials with different X, Y, Z, V, W compositions and of different purity levels can be expediently made possible.

The production of interfaces between $A_{1X} B_{1Y} C_{1Z} N_{1V} M_{1W}/A_{2X} B_{2Y} C_{2Z} N_{2V} M_{2W}$ strata can be expediently made possible with unrestrictedly reproducible adjustable transition profiles.

The expedient possibility is available to adjust the electrical characteristics of interfaces by adjusting the temperature profile in the reaction chamber and the temperature increasing schema during the manufacturing process, together with an appropriate switching sequence of the gases. The electrical characteristics such as the charge density and the impurity density as well as the structure and the state density at the interfaces are used for achieving an adjustment of the recombination energy in $A_{1X} B_{1Y} C_{1Z} N_{1V} M_{1W}/A_{2X} B_{2Y} C_{2Z} N_{2V} M_{2W}$ hetero structures by internal and external electrical fields due to the band bending. Hetero structures with stratum thicknesses of a few micrometers up to a fraction of a mono stratum with defined optical and electrical characteristics can be produced by means of this temperature management system.

Another expediently predeterminable characteristic is the surface morphology of the semiconductor materials.

Other expediently predeterminable characteristics are the particle density and the impurity density on the wafer surface.

Another advantage resides in the possibility to permit a reproducible and highly homogeneous or uniform application of $A_X B_Y C_Z N_V M_W$ components with respect to doping, stratum thickness, composition and any other properties relevant for applications.

The control of the temperature at the inlet $T_1$ in accordance with one embodiment, the manner of condensation of the gases for wafer coating is expediently adjusted.

When the temperature at the reactor walls $T_2$ is controlled in correspondence with another embodiment, a temperature difference between this temperature and the temperature of the principal wafer support $T_3$ is avoided so that energy cannot flow and a flow cannot occur between these elements of the reaction chamber. As a consequence, a homogeneous thorough condensation of the gases is possible. The wafer temperature of the wafer on the satellites, which is not accessible for measurement, constitutes here the control temperature and target temperature. In this case, too, all temperatures undergo a dynamic variation because the reaction chamber walls and the principal wafer support are made of different materials (carbon and metal) and are substantially influenced by the thermal radiation. Control is very difficult.

When the temperature of the principal wafer support $T_3$ is controlled in correspondence of another embodiment the temperature profile in the reaction chamber and the temperature increase scheme is determined during the production process in a reproducible manner. Hence, the adjustment of the electrical characteristics of interfaces is expediently permitted by adjustment of the temperature profile in the reaction chamber and the temperature increase scheme during the production process, together with an appropriate switching sequence of the gases.

The control of the temperature of rotating individual wafer supports $T_4$ in correspondence with another embodiment results in coupling of all manufacturing conditions of the individual wafer supports to those of the principal wafer support. Hence all the wafers are expediently produced in a uniform quality.

When the temperature of the gas outlet $T_5$ is controlled in accordance with a further embodiment a temperature gradient and hence the energy flow and the gas flow between the wafer supports and the gas outlet is expediently determined in a reproducible manner. In control of $T_5$ (gas outlet)<$T_4$ (wafer support)<$T_3$ (principal wafer support) the temperature dynamics must also be considered because only the wafer support is actively heated and the cooling characteristics must be appropriately considered.

When the temperature of the gas mixing system $T_6$ is controlled in correspondence with another embodiment this temperature and a temperature gradient—and hence the energy flow and the gas flow between the inlet and the gas mixing system—are expediently determined in a reproducible manner.

Despite the temperature dynamics of $T_8$ or $T_1$, respectively, of 20 to 1400° C., for example, $T_6$ must be kept at a constant level.

Control of the temperature of the upper side of the reaction chamber T7 in correspondence with a further embodiment permits a uniform and reproducible determination of this temperature as well as of a temperature gradient and hence the energy flow and the gas flow between the upper side of the reaction chamber and the principal wafer support.

With control of the temperature of the heating system $T_8$ according to another embodiment this temperature and consequently the temperature of the principal wafer support $T_3$ are uniformly and reproducibly determined.

In the controllers of $T_7$, $T_8$ and $T_3$ the dynamics and the heating/cooling means must equally be considered.

The additional control of the parameters in accordance with one of the further dependent claims, the characteristics of the X, Y, Z, V, W compositions as well as the specific electrical electron concentration and the specific electric hole concentration can be set in an adjustable manner. The gas flow must, however, be controlled in correlation with the dynamic temperature variations or else the characteristics of the component will vary. A variation of the gas flow produces equally a response to the temperature distribution, e.g. on the thermal conductivity and the cooling behaviour.

With the process steps defined in the dependent claims it is furthermore expediently possible to manufacture manifold products containing $A_X B_Y C_Z N_V M_W$ material components, which are defined, for instance, by strata, interfaces, strata successions and hetero structures with appropriate characteristics such as surface morphology, doping, composition, purity, impurity density.

On account of the temperature-controlled injection, which is provided in another embodiment, furthermore the expedient possibility is created for adjustment of the homogeneity, the surface properties and the characteristics of the strata.

The claims defining the temperature management and reaction chamber system are the device claims corresponding to the method claims, from which corresponding advantages derive.

BRIEF DESCRIPTION OF THE DRAWING

The invention will be described below, without any restriction of the general inventive idea, by exemplary embodiments, with reference being made to the drawing to which, in all other respects, explicit reference is made with respect to the disclosure of all inventive details which are not explained more thoroughly in the text. In the drawing.

DESCRIPTION OF AN EMBODIMENT

Figure 1:
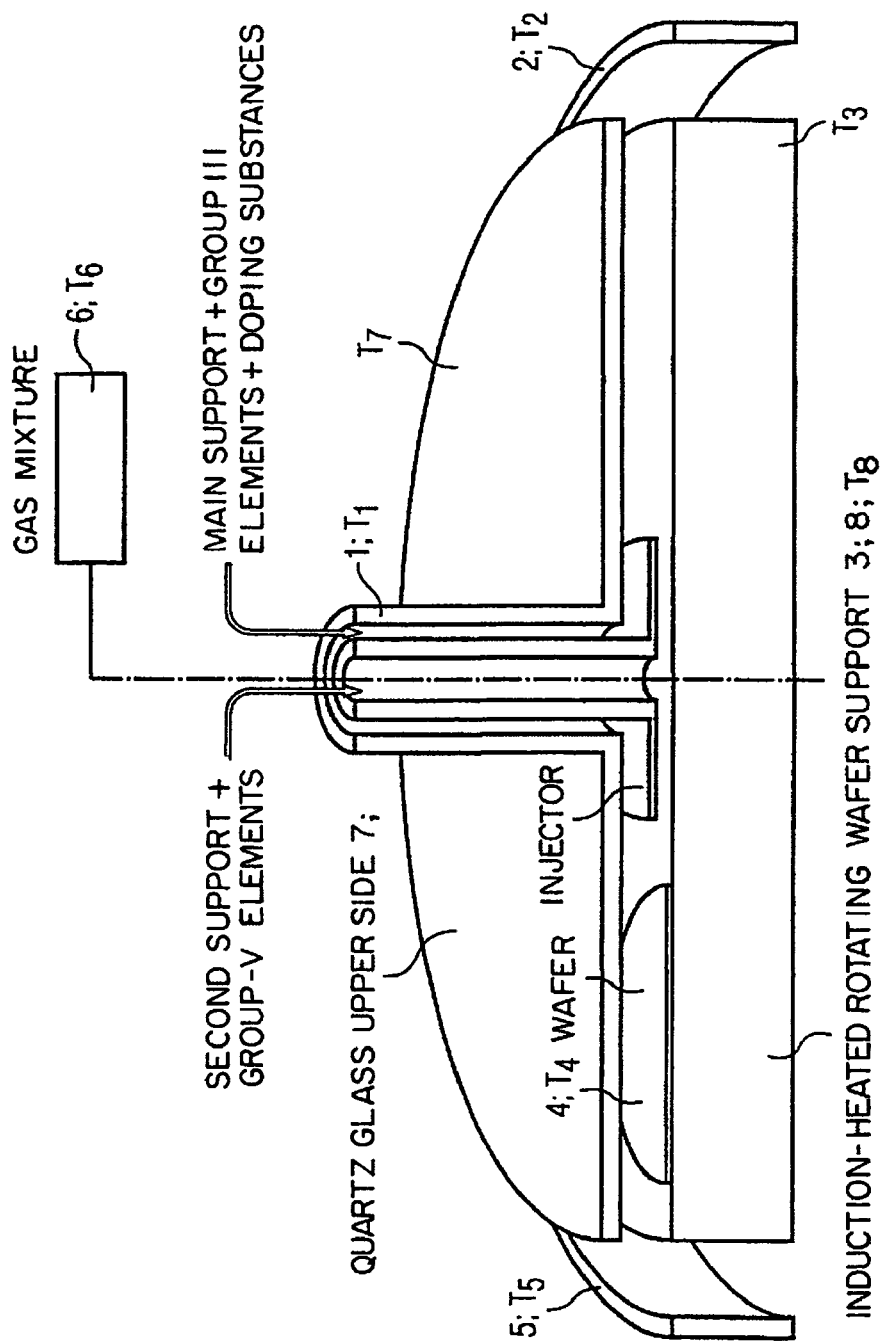
FIG. 1 is a schematic illustration of the measuring points and the recirculation loops in the reaction chamber.

First of all, the structure of the reaction chamber system and the temperature measuring points hence important for the temperature management system will be described for the following temperatures. FIG. 1 illustrates this set-up. The reference numeral 1 identifies an inlet of the reaction chamber system presenting the temperature $T_1$. The reference numeral 2 indicates reaction chamber walls having the temperature $T_2$. The reference numeral 3 identifies a principal wafer support at the temperature $T_3$. The reference numeral 4 corresponds to rotating individual wafer supports displaying the temperature $T_4$. The reference numeral 5 identifies a gas outlet at the temperature $T_5$. The reference numeral 6 indicates a gas mixing system at the temperature level $T_6$. The reference numeral 7 corresponds to the upper side of a reaction vessel at the temperature $T_7$. The reference numeral 8 corresponds to a heating system presenting the temperature $T_8$.

The reaction chamber consists of a horizontal carrier for the wafers. The reaction gases are injected from above, with a horizontal gas flow being created. The method requires a separation between the determined gases in combination with temperature control. In accordance with this embodiment the temperatures $T_1$ to $T_8$ are precisely adjusted and controlled. For optimisation of the production process further temperatures may be additionally employed as parameters.

It is possible to optimise the characteristics mentioned by way of introduction on the basis of the parameters.

The thermal management controller and the re-circulation systems or controllers, respectively, are based on thermal conduction and thermal flow. The temperature adjustment is achieved by active heating, thermal radiation and cooling, using liquids and gases. The system is determined by several regularly monitored measuring points, with the measured values being recorded. The temperatures are adjusted in order to carry out the required temperature settings.

Figure 2:
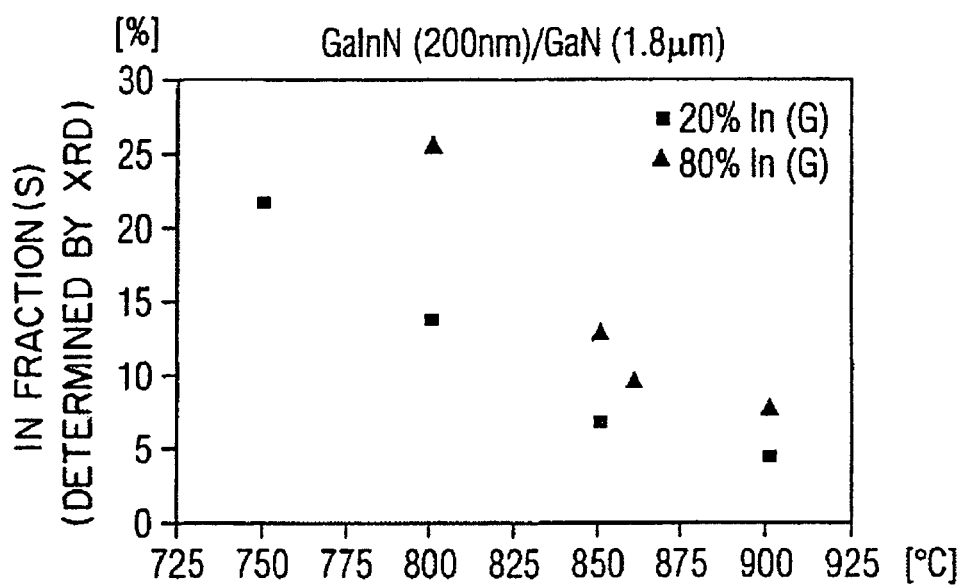
FIG. 2 illustrates the temperature dependence of the In incorporation of InGaN relative to the temperature $T_3$.

FIG. 2 shows the dependence of the In incorporation of InGaN as an example of an $A_XB_YC_ZN_VM_W$ material as a function of the temperature of the principal wafer support $T_3$.

Within the temperature range of $T_3$ from 725° C. to 925° C. a reduction of the In fraction in the InGaN material from roughly 25% to 5% can be noted.

Figure 3:
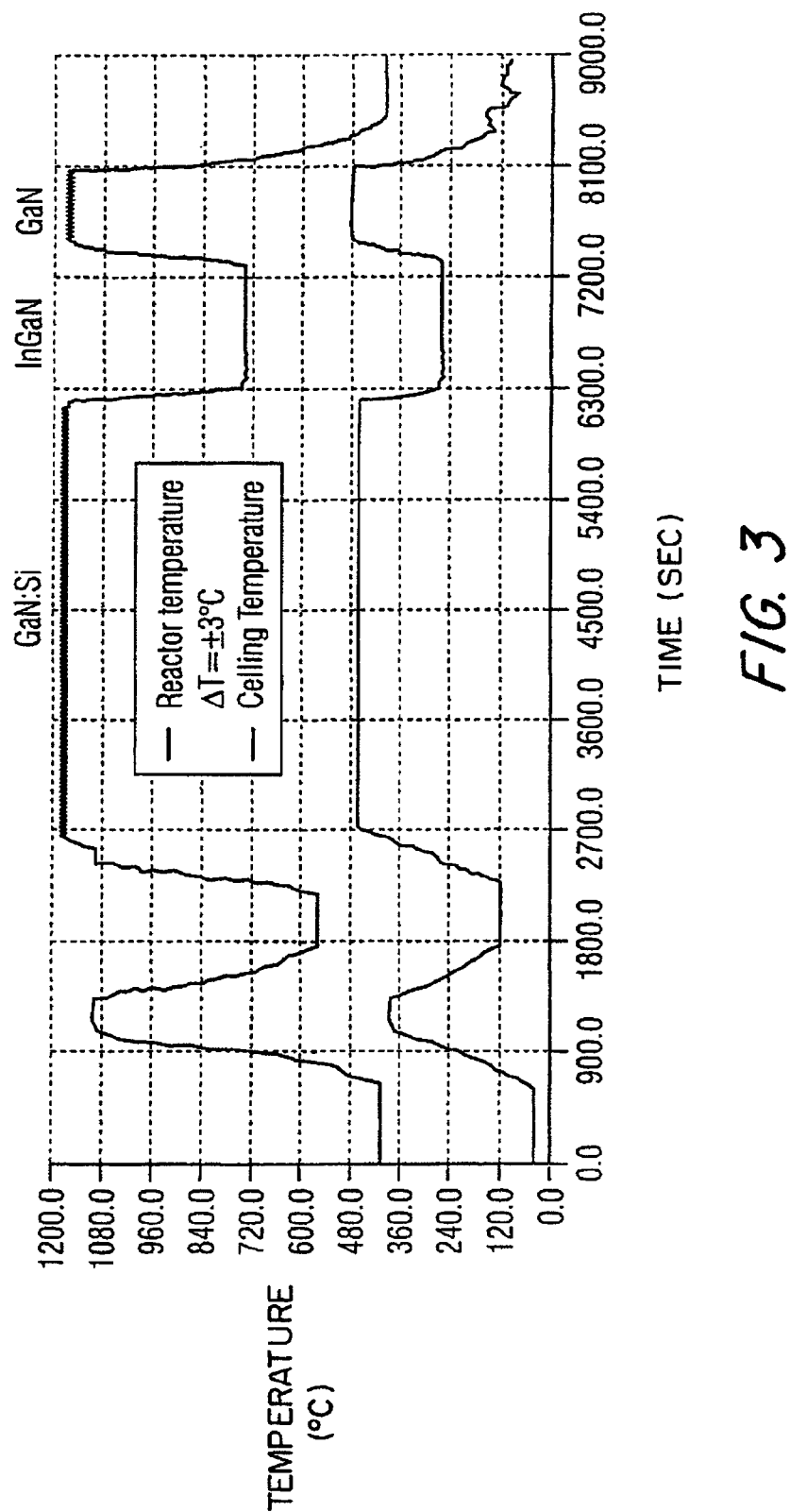
FIG. 3 represents the temperature profiles of the temperatures $T_3$ and $T_7$ for the production of GaN/InGaN hetero structures.

FIG. 3 illustrates temperature profiles of the temperatures $T_3$ and $T_7$ for the production of GaN/InGaN hetero structures in correspondence with this embodiment.

The inventive process for the production to semiconductors of the form $A_XB_YC_ZN_VM_W$ requires the application of different temperature ranges. The temperature ranges (cf., for instance, the temperature variation profile according to FIG. 3) are in particular:

400–600° C. for the nucleation stratum between the substrate and active strata

200–800° C. for the optically active layers

1000–1400° C. for electrically active envelope strata surrounding the optically active stratum.

The temperature dynamics—and not only the absolute stability—is a decisive determinant for the behaviour of the component, such as the colour of a light-emitting diode. This applies to all the characteristics mentioned above in the Chapter "Brief description of the invention":

The criterion that temperatures below the condensation temperature must be set is not applicable here. In fact, deposits on parts of the reactor are tolerated in order to achieve temperate and gas phase compositions which result in the desired characteristics of the component. The temperatures are so set in the optically active layer (700–800° C.), for example, that a non-homogeneous distribution of the materials is enforced in the semiconductor. The control function should be realised, however, in such a way that an addition compound will not be formed.

This inventive temperature management of all temperatures undergoing a dynamic variation results in entirely novel manufacturing processes. For example, the luminosity and the colour of light-emitting diodes and lasers are determined by the characteristics of the potential wells so influenced, by the interface and by the optically active medium. The possibilities to take an influence on further properties of the manufactured products are not limited.

The temperature control system and the detection of the precision as well as the temperature variation profiles—e.g.

those corresponding to FIG. 3—cannot be determined by routine because the positions are often not accessible, e.g. the gas space above the wafer. The wide temperature range from 400 to 1600° C. enforces the application of different measuring systems with a resolution in terms of time at temperature ramps, which is often not sufficient. Moreover, individual reactor parts change their thermal characteristics throughout the process, e.g. the emission behaviour, so that constantly new temperatures must be determined during each process. Extensive numerical simulations of the temperature distributions have been carried out for the implementation of the invention.

Figure 3A:
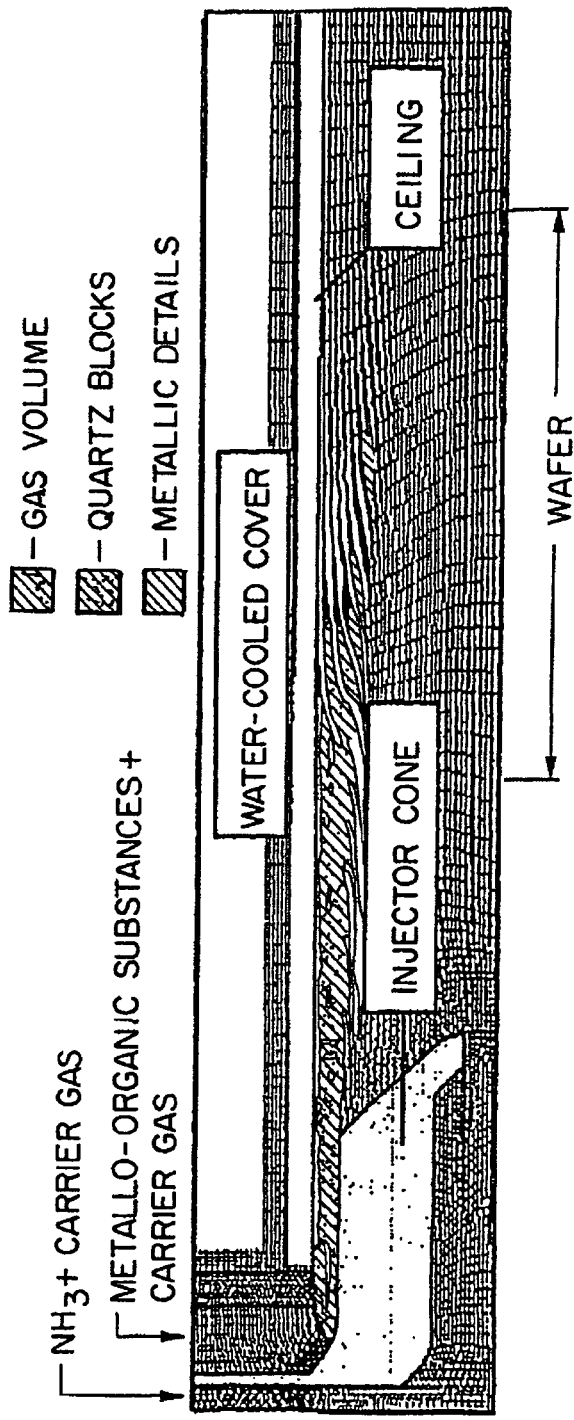
FIG. 3a is a view of a model of the mass transfer in the reactor.
Figure 3B:
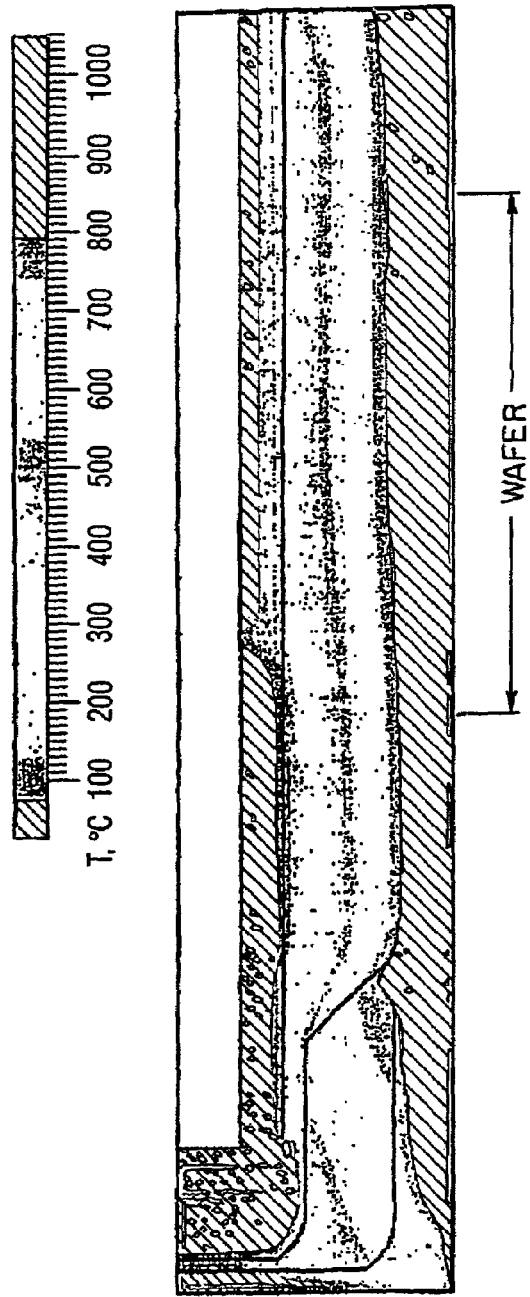
FIG. 3b represents a conceivable temperature distribution in the reactor.
Figure 3C:
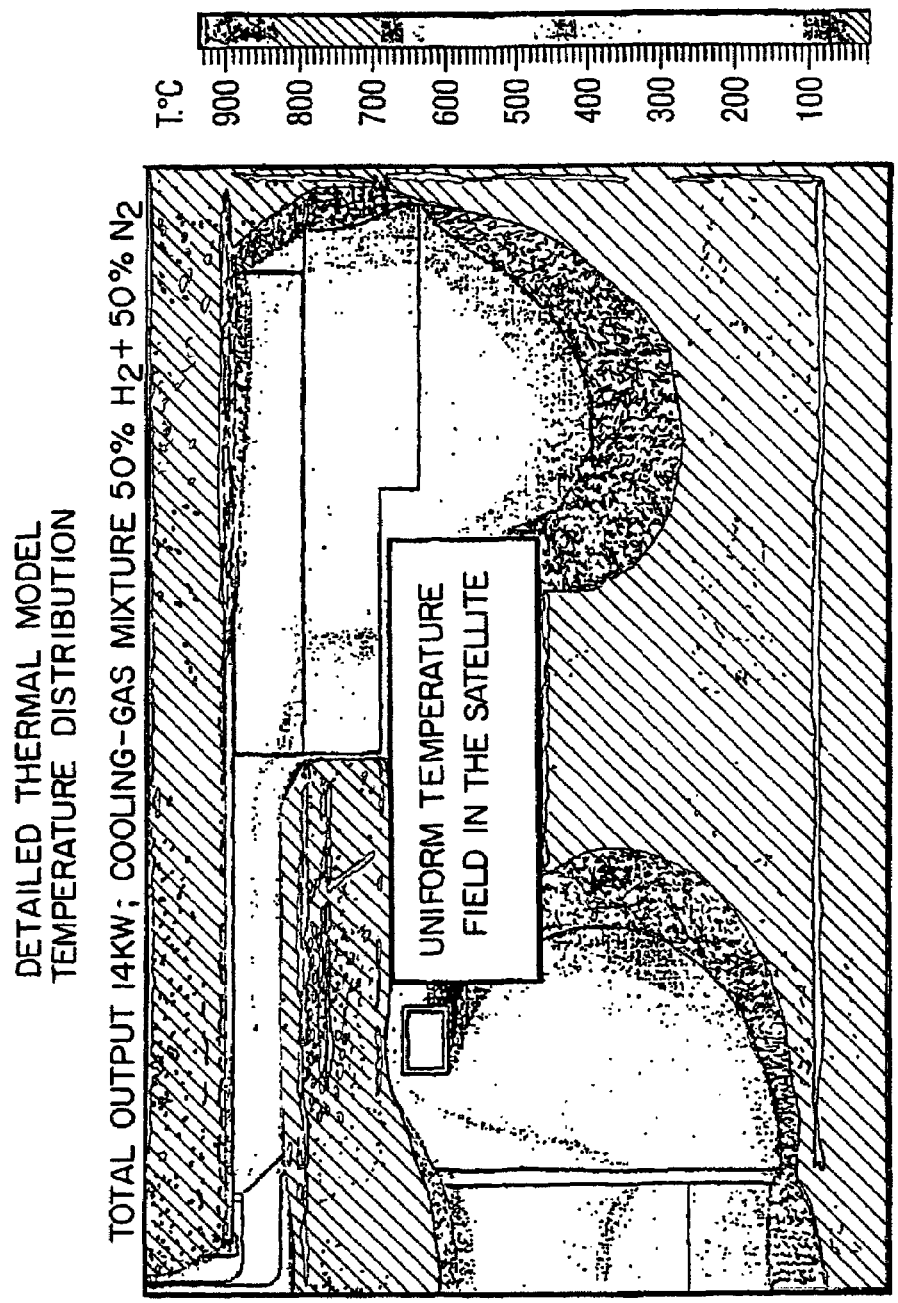
FIG. 3c shows a thermal model of an inventive temperature and reaction chamber system.

FIGS. 3a to 3c are illustrations relating to simulations serving to optimise the reactor in particular. These are the bases for optimised temperature profiles.

FIG. 3a shows a model of the mass transfer in the reactor. The observed zone and the points are described where calculations are made (lattice). This applies to both the mass transfer and the temperature behaviour.

FIG. 3b illustrates the temperature distribution throughout the reactor. Both the temperature distribution and the assumption are described in the model. Moreover, positions are detected which are inaccessible for measuring purposes.

FIG. 3c illustrates a thermal model reflecting additional details and relating to almost all parts of the inventive reactor or temperature and reaction chamber system.

Figure 4:
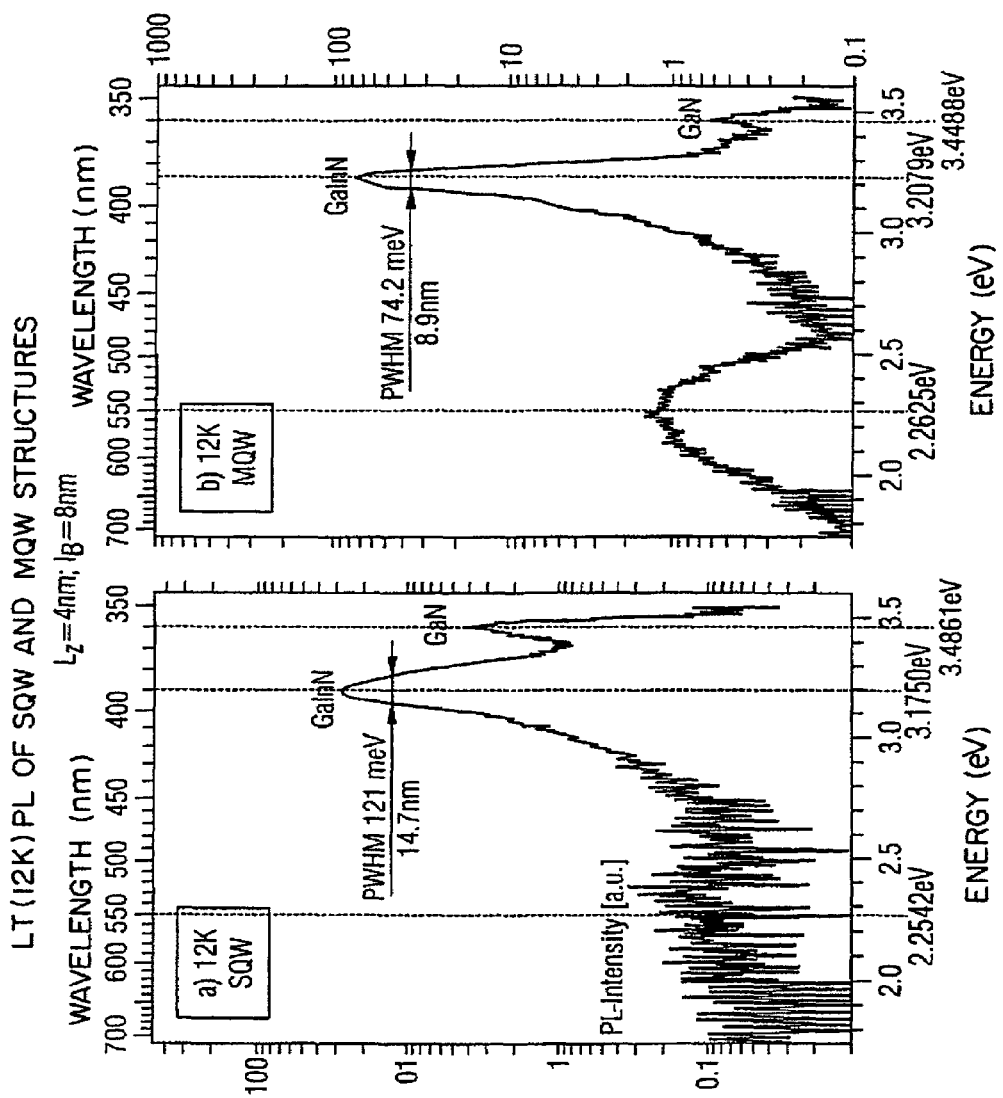
FIG. 4 illustrates the optical properties of InGaN/GaN quantum wells manufactured with the inventive temperature management system.

FIG. 4 illustrates the optical characteristics of InGaN/GaN quantum wells manufactured with the inventive temperature management system.

There values for GaInN at 3.17 eV for a single potential well (SQW) and at 3.20 eV for multiple potential wells (MQW) are noted, for instance.

Figure 5:
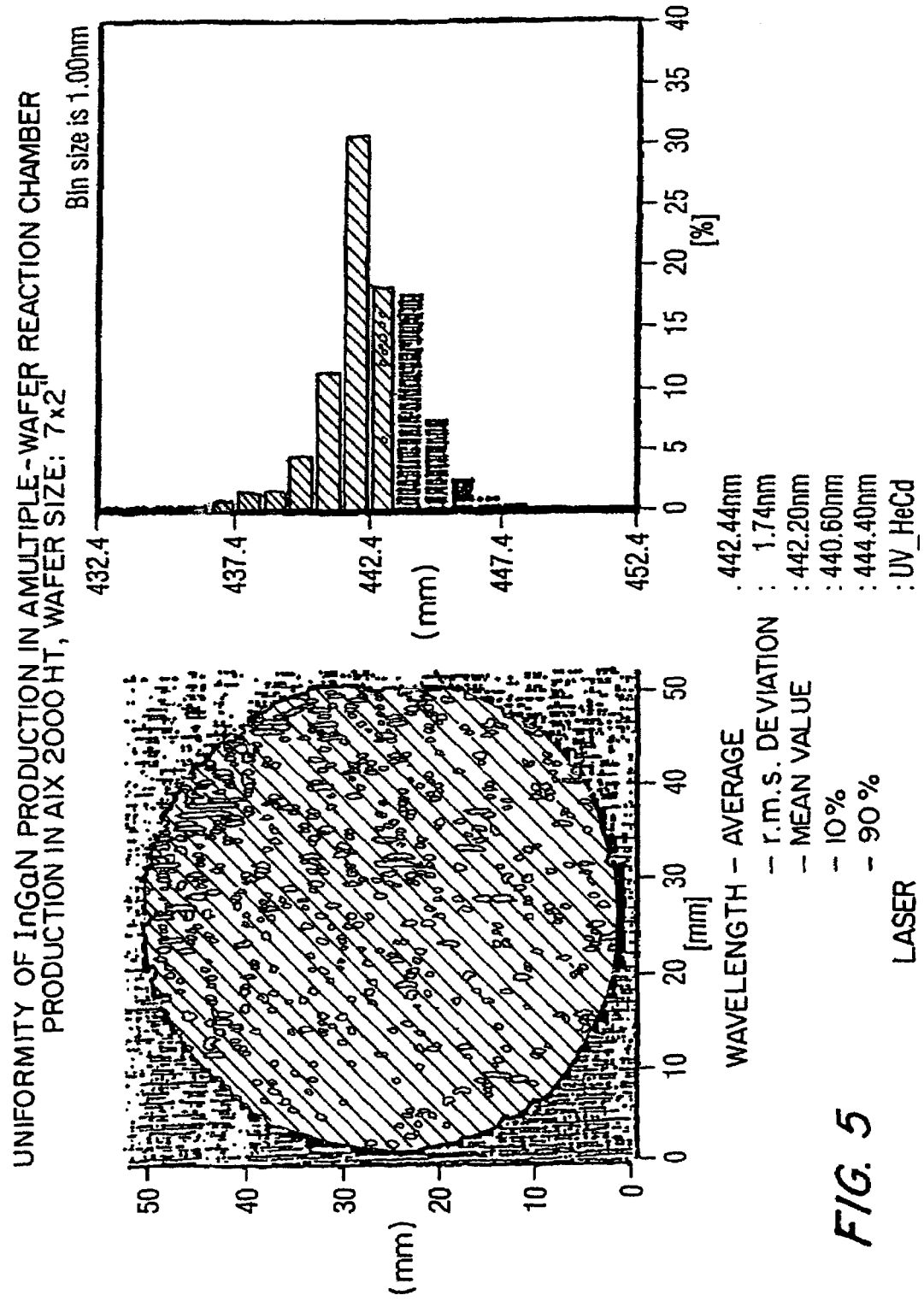
FIG. 5 illustrates the uniformity or homogeneity of the composition achieved with the inventive system.

FIG. 5 represents the homogeneity or uniformity of the composition that can be achieved with the inventive system.

Figure 6:
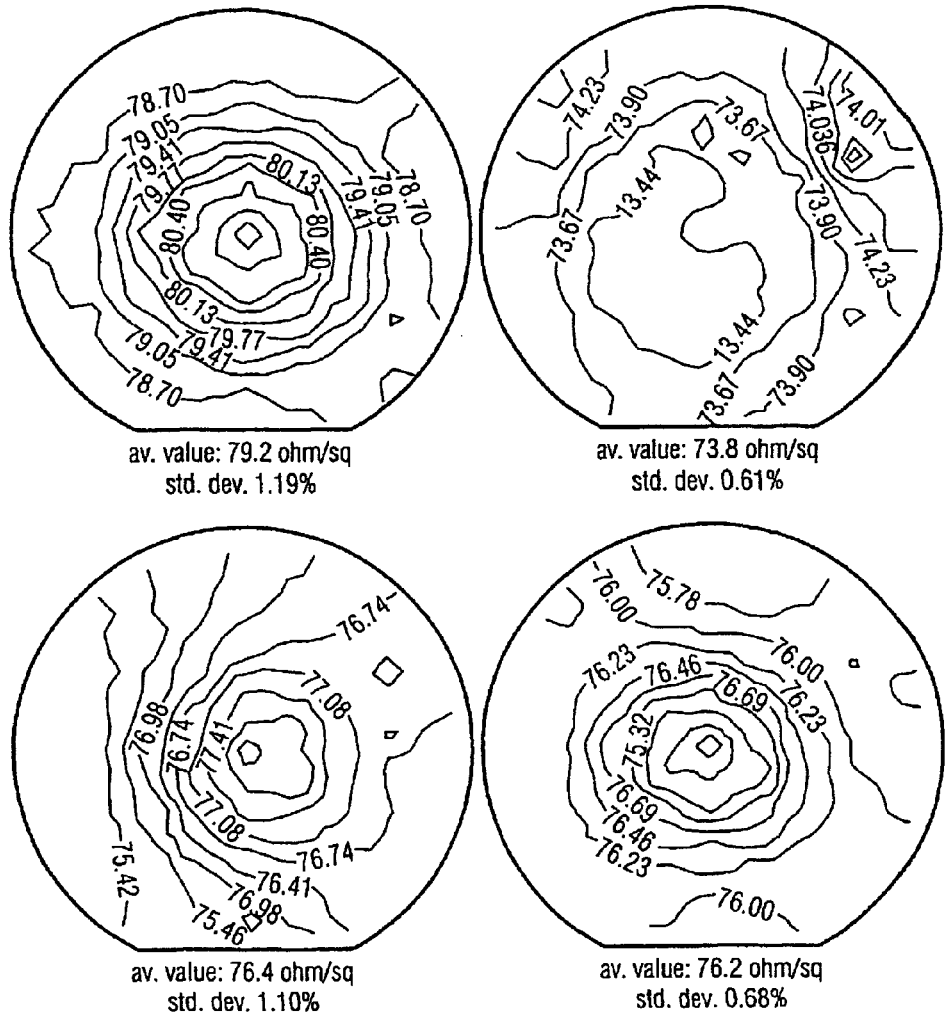
FIG. 6 illustrates the uniformity or homogeneity in doping achieved with the inventive system.

FIG. 6 is an illustration of the homogeneity or uniformity in doping that is achieved with the inventive system.

Figure 7:
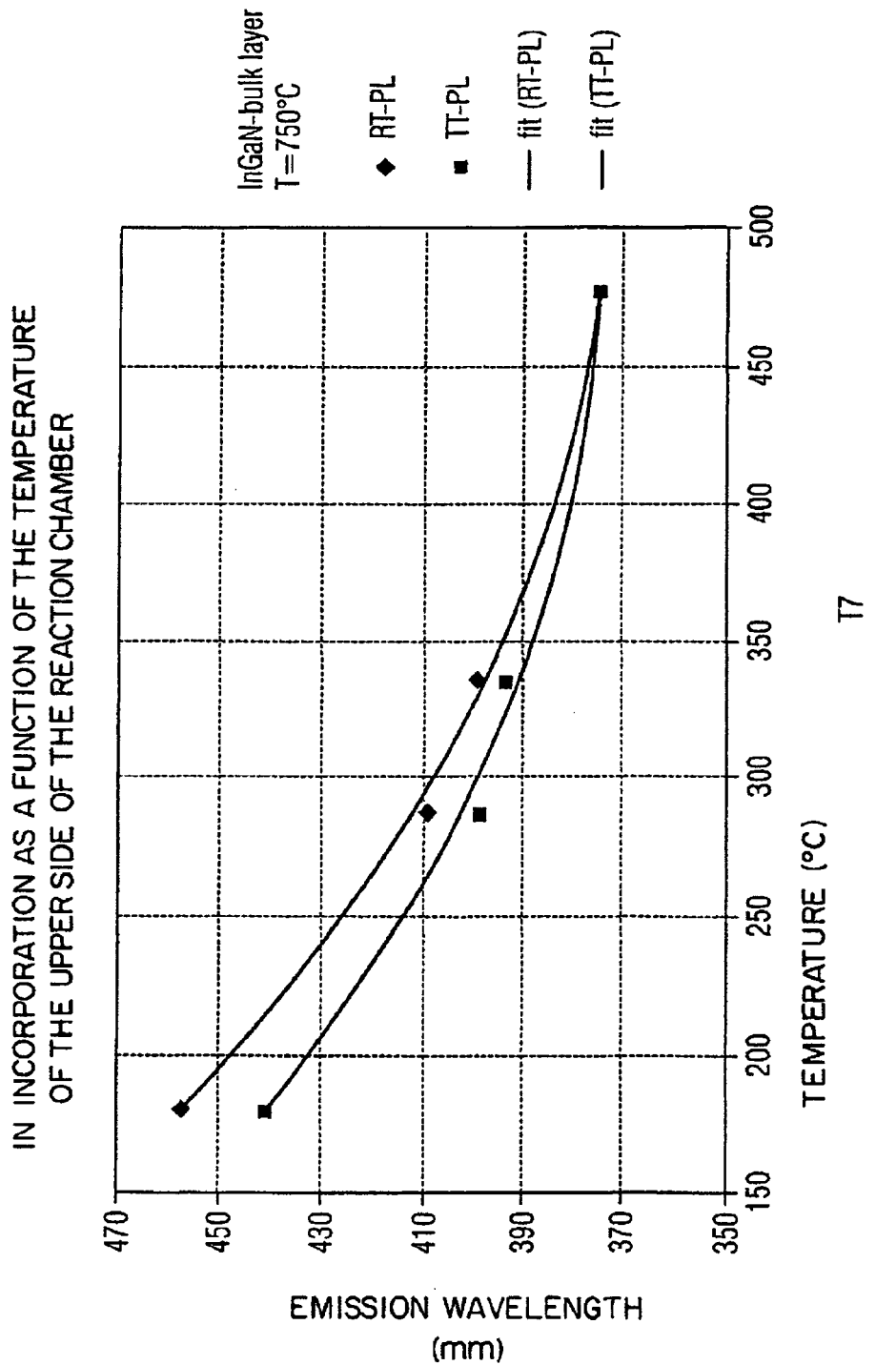
FIG. 7 represents the N-incorporation as a function of the temperature $T_7$ of the upper side of the reaction chamber, which is indicated by the emission wavelength.

FIG. 7 shows the N incorporation as a function of the temperature $T_7$ on the upper side of the reaction chamber, which is indicated by the emission wavelength. There the N incorporation is reduced as the temperature of the upper side of the reaction chamber $T_7$ increases.

Figure 8:
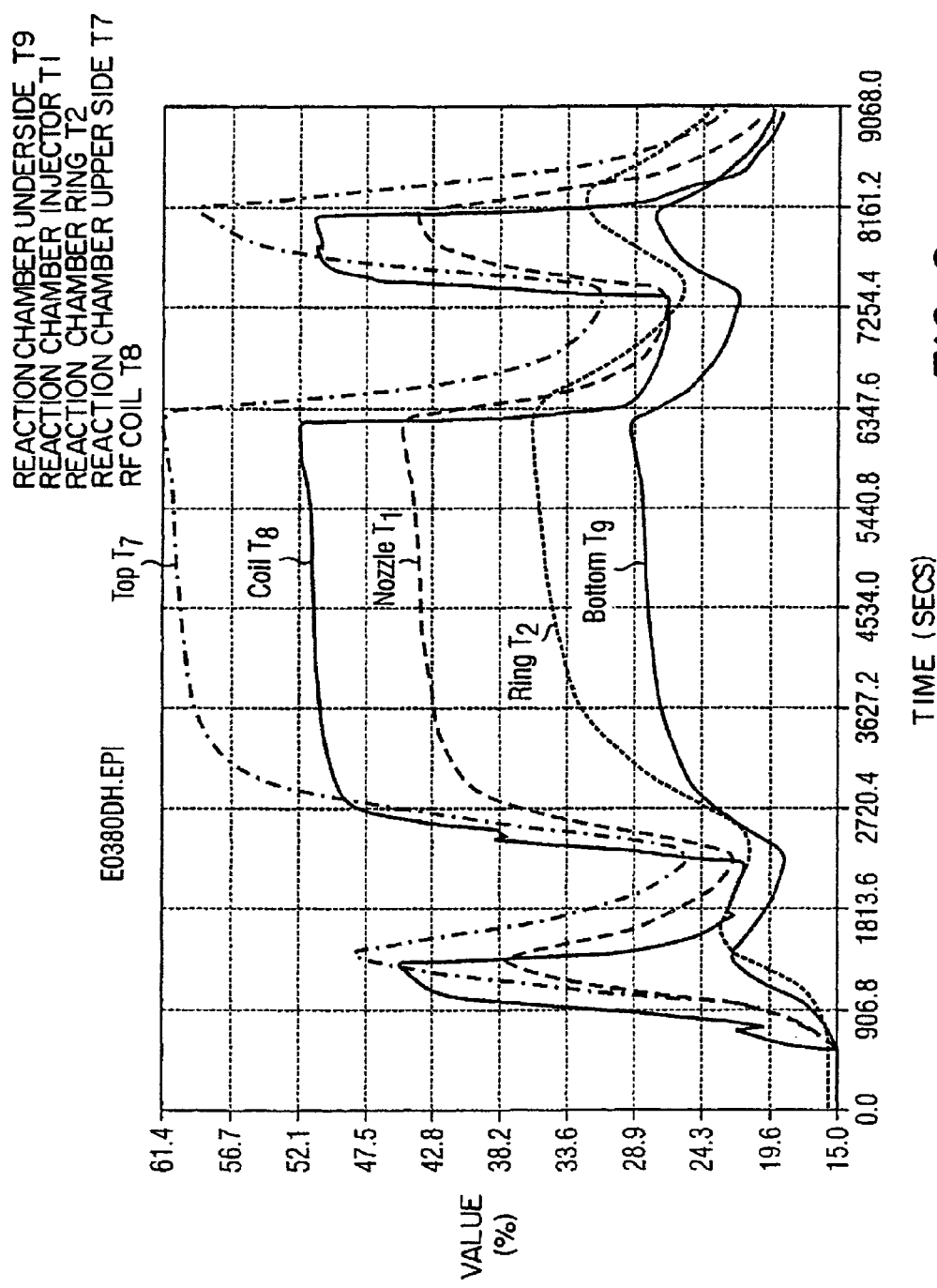
FIG. 8 shows the measurement of the temperatures $T_1$, $T_2$, $T_7$, $T_8$ and $T_9$ in the course of the process of hetero structure production.

FIG. 8 illustrates a measured development of the temperatures $T_1$, $T_2$, $T_7$, $T_8$ and $T_9$ in the course of a manufacturing processing operation of a hetero structure, expressed in percent.

In correspondence with this embodiment the temperature profiles are achieved which are specified in the process sequence for the production.

What is claimed is:

1. A method of producing nitrogenous semiconductor crystal materials of the form $A_X B_Y C_Z N_V M_W$ in the nature of strata on a wafer, wherein A, B and C represent elements of elemental group II or group III, N represents nitrogen, M represents an element of elemental group V or group VI, and X, Y, Z, V and W represent the mol fraction of each element in $A_X B_Y C_Z N_V M_W$, in a reactor comprising a reaction chamber defined by a set of chamber walls and an upper side and lower side thereof, a first wafer support positioned within the reaction chamber, a gas inlet through which process gases flow into the reaction chamber, a gas mixing system in fluid communication with the reaction chamber, a gas outlet through which the process gases are discharged from the reaction chamber, a second wafer support positioned on the first wafer support, a heating system for heating the first wafer support, and a controller for controlling the process gases and the reaction chamber; the method comprising:

growing a plurality of layers on each other, wherein the composition of the layers differ from each other due to a different composition of the gaseous phase and different growth temperatures inside the reaction chamber;

wherein a plurality of temperatures selected from the group consisting of the temperature of the gas inlet, $T_1$, the temperature of the chamber walls, $T_2$, the temperature of the first wafer support, $T_3$, the temperature of the second wafer support, $T_4$, the temperature of the gas outlet, $T_5$, the temperature of the gas mixing system, $T_6$, the temperature of the upper side of the reaction chamber, $T_7$, and the temperature of the heating system, $T_8$ are adjusted by a temperature management system;

wherein the temperature management system uses temperature variation profiles to control the plurality of temperatures and a temporal variation of at least one of the plurality of temperatures;

wherein the temperature variation profiles have been determined on the basis of numeric simulation; and controlling the temperatures of the gas outlet, $T_5$, the second wafer support $T_4$, and the first wafer support, $T_3$ such that the gas outlet, $T_5$ is less than the temperature of the second wafer support, $T_4$, and the temperature of the second wafer support, $T_4$, is less than the temperature of the first wafer support, $T_3$;

wherein the temperature adjustment is achieved by active heating, thermal radiation, and cooling.

2. The method according to claim 1 further comprising controlling the temperature of the gas inlet, $T_1$, so as to be below a condensation temperature of the process gases.

3. The method according to claim 1 further comprising controlling the temperature of the chamber walls, $T_2$, so as to be equal to the temperature of the first wafer support, $T_3$.

4. The method according to claim 1 wherein the step of controlling the temperatures comprises controlling the temperature of the first wafer support, $T_3$, as a constant temperature.

5. The method of claim 4 comprising controlling the temperature of the first wafer support, $T_3$, up to about 1600 degrees centigrade.

6. The method of claim 5 comprising controlling the temperature of the first wafer support, $T_3$, with temperature variations of up to 250 degrees per minute.

7. The method of claim 4 comprising controlling the temperature of the first wafer support to an accuracy of 0.1 degrees centigrade.

8. The method according to claim 1 wherein the step of controlling the temperatures comprises controlling the temperature of the second wafer support, $T_4$, in correspondence with the temperature of the first wafer support, $T_3$.

9. The method according to claim 1 further comprising controlling the temperature of the gas mixing system, $T_6$, as a constant temperature smaller than the temperature of the gas inlet, $T_1$.

10. The method according to claim 1 further comprising controlling the temperature of the upper side of the reaction chamber, $T_7$, as a constant temperature in correspondence with the temperature of the first wafer support, $T_3$.

11. The method according to claim 1 further comprising controlling the temperature of the heating system, $T_8$, as a constant temperature in correspondence with the temperature of the first wafer support, $T_3$.

12. The method according to claim 1 further comprising controlling a temperature-dependent gas flow variation.

13. The method according to claim 1 further comprising controlling a temperature-dependent total pressure variation in the reaction chamber.

14. The method according to claim 1 further comprising controlling a temperature-dependent principal carrier gas variation in the reaction chamber.

15. The method according to claim 1 further comprising controlling temperature-dependent interrupts in the production process.

16. The method according to claim 1 further comprising applying the semiconductor materials to be produced on a mechanical carrier of a semiconductor of group IV, a semiconductor of groups III–V, oxides or any other material resistant to temperatures and the process gases.

17. The method according to claim 16 further comprising pre-treating said mechanical carrier by applying lines, dots, or by carrying out other steps for surface treatment, or by partially covering the surface with other materials or material components.

18. The method according to claim 1 further comprising a two-stage application of pre-processed $A_X B_Y C_Z N_V M_W$ materials.

19. The method according to claim 1 wherein controlling the plurality of temperatures comprises employing a temperature-controlled injector.

* * * * *